United States Patent
Tedd et al.

(10) Patent No.: US 9,201,099 B2
(45) Date of Patent: Dec. 1, 2015

(54) COMPACT SHUNT FOR CURRENT MEASUREMENT

(71) Applicant: Tektronix, Inc., Beaverton, OR (US)

(72) Inventors: Andrew John Tedd, Fort Myers, FL (US); John Stewart Ford, Sanibel, FL (US); Lionel Ind, Oxford (GB)

(73) Assignee: TEKTRONIX, INC., Beaverton, OR (US)

( * ) Notice: Subject to any disclaimer, the term of this patent is extended or adjusted under 35 U.S.C. 154(b) by 222 days.

(21) Appl. No.: 13/895,811

(22) Filed: May 16, 2013

(65) Prior Publication Data

US 2014/0210454 A1    Jul. 31, 2014

Related U.S. Application Data

(60) Provisional application No. 61/757,011, filed on Jan. 25, 2013.

(51) Int. Cl.
*G01R 1/20* (2006.01)
*H01G 4/30* (2006.01)
*H01G 4/33* (2006.01)

(52) U.S. Cl.
CPC ........ *G01R 1/203* (2013.01); *H01G 4/30* (2013.01); *H01G 4/33* (2013.01)

(58) Field of Classification Search
CPC ...... G01R 1/203; G01R 15/16; G01R 15/207; G01R 19/0092
USPC ........... 324/126; 333/172; 156/222; 148/273; 29/25.42; 361/305, 322, 523; 428/377, 428/384, 78; 427/79
See application file for complete search history.

(56) References Cited

U.S. PATENT DOCUMENTS

| | | | |
|---|---|---|---|
| 496,501 A | 5/1893 | Weston | |
| 1,008,326 A | 11/1911 | Grigsby | |
| 2,223,585 A * | 12/1940 | Tarpley | 323/354 |

(Continued)

FOREIGN PATENT DOCUMENTS

| | | | | |
|---|---|---|---|---|
| DE | 29610403 | | 8/1996 | |
| EP | 2169412 A1 * | | 3/2010 | G01R 1/20 |
| FR | 2079959 | | 11/1971 | |
| WO | WO 2010026380 A1 * | | 3/2010 | H01B 7/30 |

OTHER PUBLICATIONS

EPO, Extended European Search Report, EP13168439.1, Munich, Germany, Jul. 7, 2014, pp. 1-5.

*Primary Examiner* — Melissa Koval
*Assistant Examiner* — Felicia Farrow
(74) *Attorney, Agent, or Firm* — Michael A. Nelson; Marger Johnson

(57) ABSTRACT

Conductive strips are stacked, insulated, folded, and formed into geometric shapes to provide a low resistance, low inductance, shunt, wherein the geometric shape readily enables cooling to reduce changes in resistance due to self-heating effects. One such geometric shape is attained by winding the conductive strips into a spiral. Another geometric shape is a shape resembling a wave. Both geometric shapes allow cooling by directing airflow from a fan across their surface portions. A variable-speed cooling-fan is controlled in response to measured temperature of the shunt, or in response to a measurement of the current through the shunt. Differential cooling may be employed by means of changing the amount of airflow across various portions of the shunt in response to measured temperature of the shunt.

12 Claims, 4 Drawing Sheets

(56) References Cited

U.S. PATENT DOCUMENTS

| | | | | |
|---|---|---|---|---|
| 3,353,124 | A | * | 11/1967 | Dilger .......................... 333/172 |
| 6,351,115 | B1 | * | 2/2002 | Kasunich ..................... 324/126 |
| 6,876,291 | B2 | * | 4/2005 | Teppan ......................... 338/61 |
| 7,591,302 | B1 | * | 9/2009 | Lenehan et al. .............. 165/247 |
| 2004/0250393 | A1 | * | 12/2004 | Mandelcorn et al. ........ 29/25.42 |
| 2007/0259561 | A1 | | 11/2007 | Clem |
| 2009/0046414 | A1 | * | 2/2009 | Schmidt ........................ 361/523 |

* cited by examiner

COMPACT SHUNT FOR CURRENT MEASUREMENT

CROSS REFERENCE TO RELATED APPLICATIONS

This application claims the benefit of U.S. provisional application Ser. No. 61/757,011, filed Jan. 25, 2013, herein incorporated by reference.

FIELD OF THE INVENTION

The subject invention generally concerns a shunt for measurement of electrical current, and specifically concerns a low resistance shunt suitable for use at high frequencies.

BACKGROUND OF THE INVENTION

An example of a shunt, as known from the prior art is a coaxial shunt. As the name would imply, a coaxial shunt comprises two concentric cylinders in which current flows down an inner cylinder and returns via the outer cylinder. This construction offers low inductance because both currents flow oppositely in almost in same position in space. However, coaxial shunts exhibit certain disadvantages. For example, they are relatively expensive to produce. They tend to be bulky, and they are difficult to cool.

A second prior art shunt is a "flat shunt". A flat shunt comprises a long metal strip, folded in half, with thin layer of insulation placed between the folded portions. This arrangement offers low inductance, but, it too, is bulky and is even more difficult to cool than is the coaxial shunt.

What is needed is a shunt arrangement for current measurement that exhibits low change in resistance (e.g. minimum temperature rise) due to self-heating caused by current flow, and low inductance to maintain flat response over a wide frequency range.

SUMMARY

According to the invention, conductive strips can be insulated, folded, and formed into geometric shapes to provide a low resistance, low inductance, shunt, wherein the geometric shape is contoured to more readily enable cooling measures to reduce changes in resistance due to self-heating effects. One such geometric shape is attained by winding the conductive strips into a spiral. Another such geometric shape is attained by loosely folding the conductive strips into a shape resembling a wave. Both of these geometric shapes allow cooling by directing airflow, e.g., from a fan, across the surface portions of each shape. Another embodiment of the invention includes the use of a variable-speed cooling-fan in response to measured temperature of the shunt. Yet another embodiment of the invention is differential cooling by means of changing the amount of airflow across various portions of the shunt in response to measured temperature of the shunt. In yet other embodiments of the invention, the variable-speed fan, or the variable airflow, is controlled in response to a measurement of the current through the shunt.

The foregoing and other objects, features and advantages of the invention will become more readily apparent from the following detailed description of a preferred embodiment of the invention which proceeds with reference to the accompanying drawings.

DETAILED DESCRIPTION OF EMBODIMENTS

Figure 1:
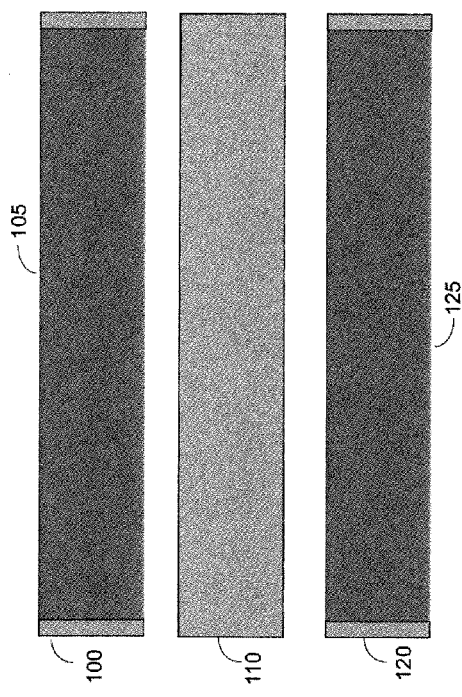
FIG. 1 shows in plan view three conductive strips in accordance with an embodiment of the subject invention.
Figure 2:
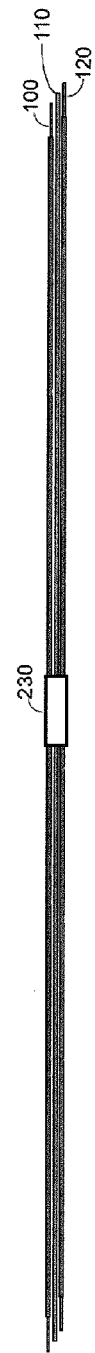
FIG. 2 shows in side view a step in the construction of a shunt in accordance with an embodiment of the subject invention.
Figure 3:
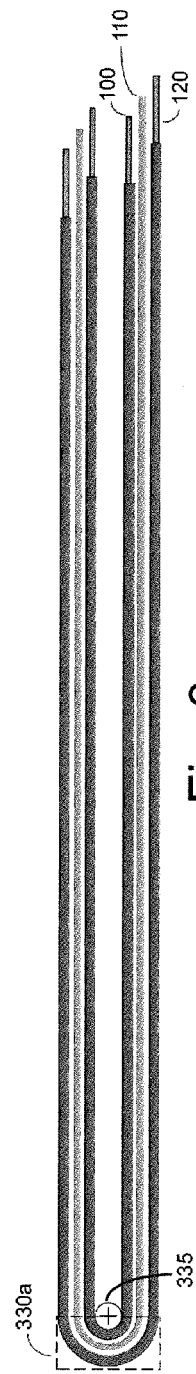
FIG. 3 shows in side view a further step in the construction of a shunt in accordance with an embodiment of the subject invention.
Figure 4:
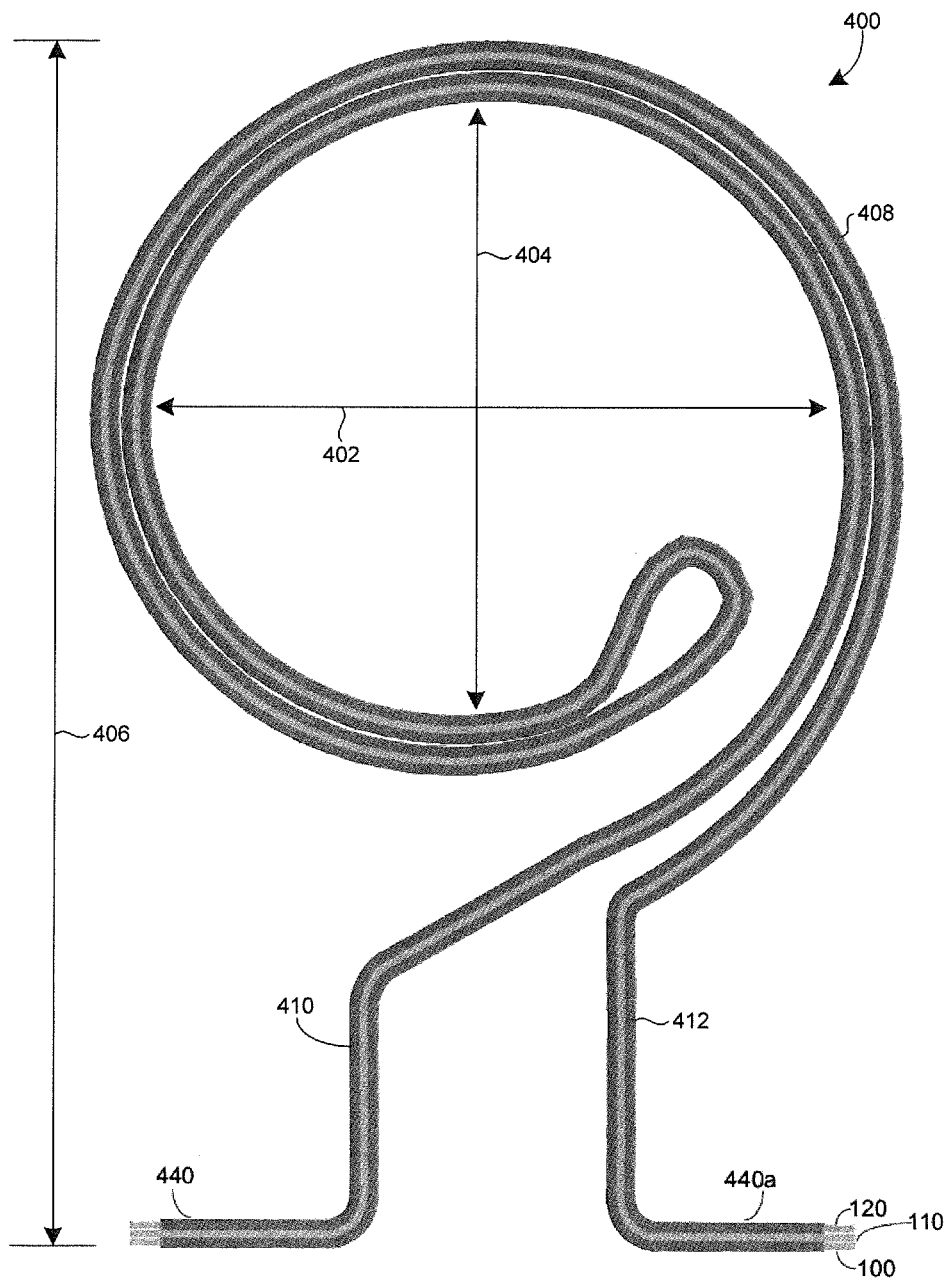
FIG. 4 shows a side view of the shunt construction of FIG. 3 wound into a spiral geometric shape.
Figure 5:
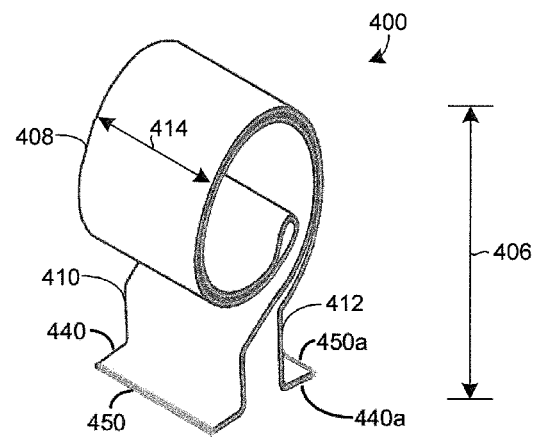
FIG. 5 shows a perspective view of the embodiment of FIG. 4 wound into a spiral geometric shape.
Figure 6:
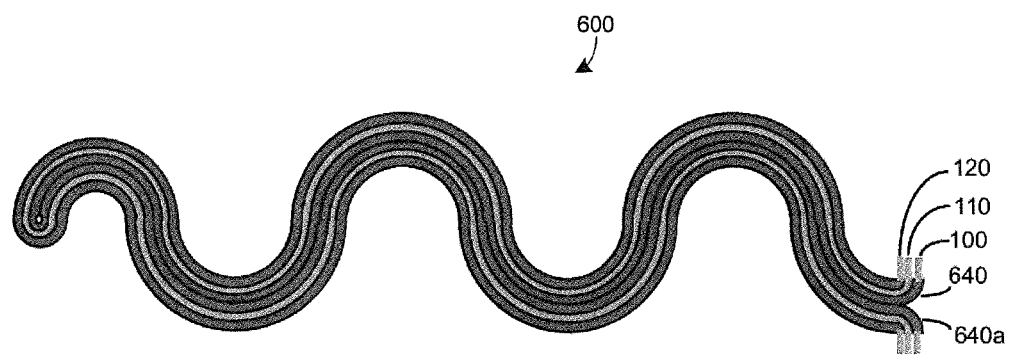
FIG. 6 shows a side view of the shunt construction of FIG. 3 formed into a wave-like geometric shape.

FIGS. 1-3 show initial steps in the construction of various embodiments of a shunt according to the invention as shown in FIGS. 4-6.

FIG. 1 shows three strips of Manganin® conductive material 100, 110, 120. This example conductive material comprises approximately 86% copper, 12% manganese, and 2% nickel. Each strip measures approximately 30 mm wide, 185 mm long, and 0.1 mm thick. Strips 100 and 120 are insulated on both sides with strips of 1.25 inch wide Kapton® tape 105, 125, leaving approximately 5 mm of bare metal exposed on each end. The tape is applied centrally to the strip.

Referring to FIG. 2, conductive strips 100, 110, 120 are stacked, but progressively longitudinally offset from one another by approximately 1.5 mm. The stack is then taped together with one turn of 12 mm Kapton tape 230 located approximately 90 mm from one end of the top strip.

FIG. 3 shows the assemblange of conductive strips 100, 110, 120 folded over a 2 mm rod 335 at the midpoint where Kapton tape 230 is applied. For clarity, Kapton tape 230 is not shown in FIG. 3, but it would be located in the area enclosed by dotted box 330a.

At this point, in one embodiment, the strips may be wound loosely by hand, but preferably wound loosely in a jig, into a spiral shape 400, as shown in FIG. 4. The resulting spiral shape has a cylindrical portion having a major (i.e., horizontal) axis 402 of approximately 21.5 mm, and a minor (i.e., vertical) axis 404 of 21 mm. The arrangement including the cylindrical portion 408 and the "legs" 410, 412 has an overall height 406 of approximately 31 mm. The spiral arrangement of FIG. 4 has two ends, 440 and 440a. Each end 440, 440a, comprises a respective opposite end of conductors 100, 110, 120. All three conductors 100, 110, 120 are now soldered together at each of ends 440, 440a. A shunt formed as described above exhibits a resistance of 9.375 mΩ (milliOhms). Preferably, the spiral is wound loosely so that air can flow between turns.

FIG. 5 shows a perspective view of the spiral embodiment of FIG. 4. As noted above, the overall height 406 of the arrangement is approximately 31 mm. The length 414 of the longitudinal axis of the cylindrical portion of the arrangement is approximately 30 mm (i.e., the width of conductive strips 100, 110, 120). As noted above, the bare ends of conductive strips 100, 110, 120 emerge at points 450, 450a and are soldered together and can be coupled respectively to input/output leads of the circuit. It is envisioned that the airflow would be directed down the length 414 of the cylinder.

Referring to FIG. 6, it is herein recognized that other geometries can also be used, such as the wave-like form 600 illustrated, to maintain a uniform temperature gradient. The construction comprises essentially the steps described above, and therefore those steps need not be described again. Similarly to the embodiment of FIG. 5, the bare ends of conductive strips 100, 110, 120 emerge at points 640, 640a and are soldered together at each end. Then, the double stack is formed into a wave-like contour as shown.

Each of these unique embodiments offers the advantage of low inductance because current flows and returns in virtually the same position in space. The exhibited low inductance allows operation at relatively higher frequencies (i.e., several MHz). Both employ compact construction. Both are easy to cool either by convection flow or by a small fan blowing air between the spirals or the waves. Both embodiments are inexpensive to produce while offering great performance. The ease of cooling is important because the shunt in a circuit may experience peak currents of 100 A and continuous currents of 30 ARMS. Preferably, the shunt is to be kept below 60° C. (140° F.).

Figure 7A:
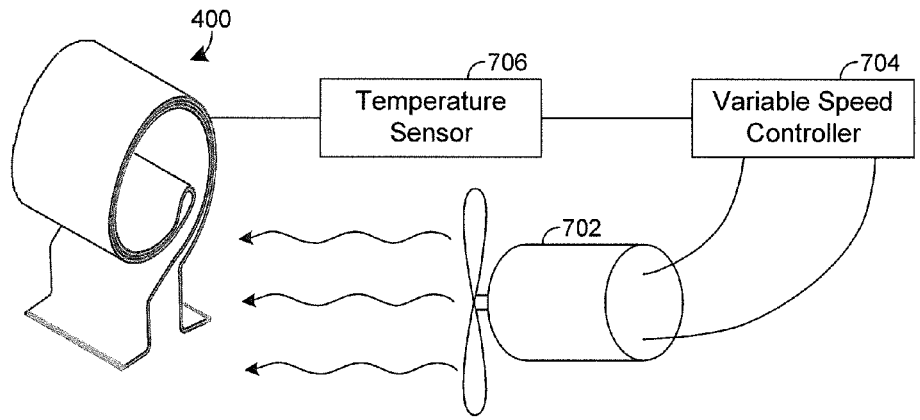
FIGS. 7A, 7B and 7C are block diagrams of three embodiments of cooling structures for the shunts of the present invention.
Figure 7B:
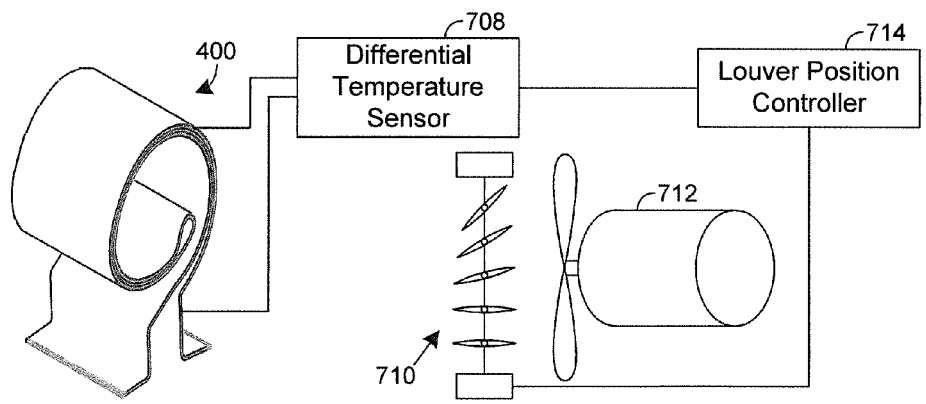
Figure 7C:
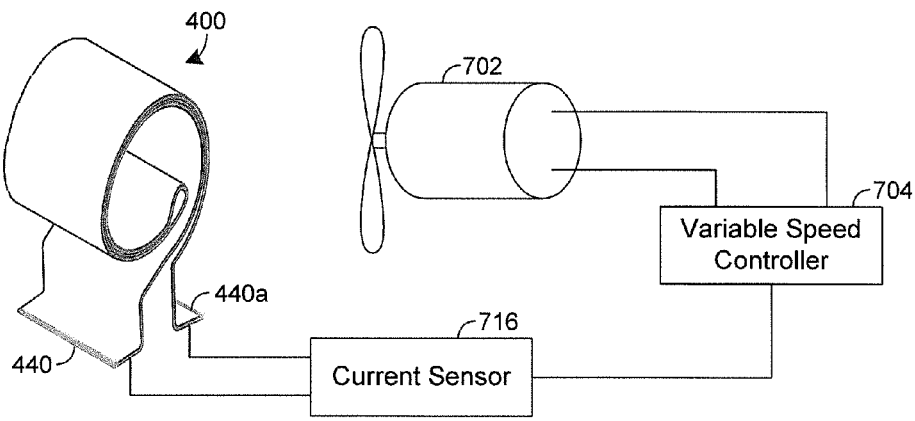

Regarding the cooling of the shunt to reduce resistance changes due to self-heating, while convection may be sufficient at low current levels, the use of a cooling-fan can be preferred. As noted, both of these geometric shapes allow cooling by directing airflow from a fan across the surface portions of each shape as shown in FIGS. 7A, 7B and 7C. Another embodiment of the invention includes the use of a variable-speed cooling-fan 702. In one embodiment of the invention, shown in FIG. 7A, the speed of the fan is controlled by a controller 704, such as a microprocessor, or the like, in response to measured temperature 706 of the shunt. Yet another embodiment of the invention, shown in FIG. 7B, employs differential cooling by means of changing the amount of airflow moving across various portions of the shunt in response to measured differential temperatures 708 of the shunt. Such changing of airflow from fan 712 may be accomplished by, for example, moveable fan louvers 710, wherein the fan louver positions are controlled by a microprocessor 714. In yet other embodiments of the invention, shown in FIG. 7C, the variable-speed fan 702, or the variable airflow (see 710), is controlled in response to a measurement of the current through the shunt. That is, it is herein recognized that sensing 716 the amount of current flowing through the shunt can be a useful surrogate for an actual temperature measurement, because the heat being produced is "I-R$^2$" (current-resistance) heating (plus ambient temperature effects). Thus, the heat produced is related to the amount of current flowing through the shunt.

Although a shunt of 9.375 mΩ was described above, other resistance values may be used, such as 0.6Ω, and such other values are intended to be included within the subject invention. Although the foregoing example uses a stack of three conductive layers, multiple layers of other numbers, such as a 2 or 4 layers, can be used.

Having described and illustrated the principles of the invention in a preferred embodiment thereof, it should be apparent that the invention can be modified in arrangement and detail without departing from such principles. We claim all modifications and variation coming within the spirit and scope of the following claims.

The invention claimed is:

1. A low inductance electrical shunt for use in an electrical circuit, comprising:
   multiple elongated conductive strips aligned and stacked to form a stack of conductive layers in overlying relationship;
   insulative layers applied centrally to at least one of the multiple strips such that each of the stacked conductive strips are electrically insulated from one another at an insulative region; and
   exposed opposite ends on each of the elongated conductive strips, the exposed ends not having insulative layers;
   the stack of conductive layers being folded into a doubled stack at approximately a lengthwise midpoint; and
   the doubled stack of conductive layers having outward surfaces extending along opposite sides of the doubled stack, the outward surfaces being substantially exposed along a lengthwise dimension such that an airflow can pass over both sides of the doubled stack of conductive layers for cooling.

2. A low inductance electrical shunt according to claim 1 in which the doubled stack of conductive strips are contoured into a spiral.

3. A low inductance electrical shunt according to claim 1 in which the doubled stack of conductive strips are contoured into a wave.

4. A low inductance electrical shunt according to claim 1 in which the multiple elongated conductive strips are substantially the same length.

5. A low inductance electrical shunt according to claim 4 in which the multiple elongated conductive strips are positioned lengthwise so that their ends are progressively offset lengthwise.

6. A low inductance electrical shunt according to claim 1 in which the exposed ends of one end of the multiple elongated conductive strips are coupled together.

7. A low inductance electrical shunt according to claim 1 in which each of the opposite ends of the multiple elongated conductive strips are coupled to a circuit so that current flows into a first set of the opposite ends and out a second set of the opposite ends, the current flowing in opposite directions through the double stack to neutralize inductance through the shunt.

8. A low inductance electrical shunt according to claim 1 in which the stack of conductive layers includes first, second and third conductive strips.

9. A low inductance electrical shunt according to claim 1, including a cooling fan for directing an airflow over the contoured doubled stack of conductive strips.

10. A low inductance electrical shunt according to claim 9 including a temperature sensor adjacent the contoured doubled stack of conductive strips to measure a temperature thereof, and a controller coupled to the cooling fan for changing the airflow in response to measured temperature of the shunt.

11. A low inductance electrical shunt according to claim 9 including two temperature sensors in proximity to different parts of the shunt and means for controlling the amount of airflow across the different parts of the shunt in response to the different measured temperatures thereof.

12. A low inductance electrical shunt according to claim 9 including a current sensor coupled to the contoured doubled stack of conductive strips for detecting an amount of current through the shunt and a controller coupled to the cooling fan for changing the airflow in response to measured current through the shunt.

\* \* \* \* \*